United States Patent
Hara et al.

[11] Patent Number: 5,994,003
[45] Date of Patent: Nov. 30, 1999

[54] SCANNING EXPOSURE METHOD AND MASK THEREFOR

[75] Inventors: Shinichi Hara, Saitama-ken; Takeshi Miyachi, Utsunomiya, both of Japan

[73] Assignee: Canon Kabushiki Kaisha, Tokyo, Japan

[21] Appl. No.: 08/935,901

[22] Filed: Sep. 23, 1997

[30] Foreign Application Priority Data

Sep. 24, 1996 [JP] Japan .................................. 8-251622

[51] Int. Cl.⁶ ...................................................... G03F 9/00
[52] U.S. Cl. ................................. 430/5; 430/397; 378/35
[58] Field of Search ................................. 430/5, 22, 394, 430/397; 378/35; 250/491.1, 492.1

[56] References Cited

U.S. PATENT DOCUMENTS

| 5,159,483 | 10/1992 | Watanabe et al. | ...................... 359/210 |
|---|---|---|---|
| 5,308,991 | 5/1994 | Kaplan | .................. 250/492.22 |
| 5,526,093 | 6/1996 | Takahashi | .................. 355/53 |
| 5,593,800 | 1/1997 | Fujioka et al. | .............................. 430/5 |
| 5,604,779 | 2/1997 | Amemiya et al. | ......................... 378/34 |
| 5,822,043 | 10/1998 | Ebinuma | .................................. 355/55 |

FOREIGN PATENT DOCUMENTS 7-130632 5/1995 Japan .
8-55785 2/1996 Japan .

*Primary Examiner*—S. Rosasco
*Attorney, Agent, or Firm*—Fitzpatrick, Cella, Harper & Scinto

[57] ABSTRACT

A scanning exposure method includes steps of relatively scanning a mask and a wafer relative to exposure light of a slit beam, to transfer a pattern of the mask onto the wafer and applying a relative speed between the mask and the wafer in a scan direction, during the scan exposure in one shot area, wherein the relative speed is changed in accordance with thermal distortion of the mask pattern caused during the scan exposure.

14 Claims, 7 Drawing Sheets

DEVIATION Dy OF
PATTERN POSITION

DEVIATION Dy OF
PATTERN POSITION

SCANNING EXPOSURE METHOD AND MASK THEREFOR

FIELD OF THE INVENTION AND RELATED ART

This invention relates to a lithographic process for scanning a mask with exposure light such as synchrotron radiation light to transfer a pattern of the mask onto a wafer. In another aspect, the invention is concerned with a mask to be used in such a process.

The degree of integration of a microdevice such as a semiconductor device is increasing more and more, and the line width of a pattern has to be reduced more and more. For a 156M DRAM, a required line width is 0.25 micron, and, for a 1G DRAM, it is 0.18 micron. The overall registration precision for superposedly printing mask patterns on a wafer through lithographic transfer is 80 nm for 256M DRAM and 60 nm for 1G DRAM.

Currently, in many cases, light of an i-line or a KrF laser is used as exposure light. However, a lithographic process which uses X-rays of shorter wavelengths has become attractive, in the viewpoint of avoiding degradation of resolution due to diffraction. As for a light source which produces X-rays, synchrotron radiation is effective because of large power and a wide bandwidth of radiation.

The synchrotron radiation comprises a sheet-like slit beam. Thus, generally, for exposure of a picture angle of a mask pattern, an X-ray reflection mirror is pivoted to scanningly deflect the radiation light relative to a mask and a wafer, which are held fixed or, alternatively, the mask and the wafer are scanningly moved relative to the sheet beam, which is held fixed, whereby the mask pattern is transferred to the wafer.

Japanese Laid-Open Patent Application, Laid-Open No. 55785/1996 shows correction of mask transfer magnification, wherein synchrotron radiation is used and, during a scan with exposure light, a wafer and a mask are relatively moved in a scan direction to thereby correct the transfer magnification.

For higher precision pattern transfer, however, distortion of a pattern other than that caused by a variation in the magnification should be considered. The temperature of a mask increases as a result of absorption of exposure light by the mask, and it causes thermal distortion of the mask itself. Taking it into account, during scan exposure, local impingement of energy causes a local temperature rise which produces a non-uniform temperature distribution. Additionally, such a temperature distribution changes with the beam scan. Then, there occurs a positional deviation of the pattern along the scan direction, as shown in FIG. 4 or 6, and pattern transfer precision is degraded correspondingly. In FIGS. 4 and 6, the positions of a pattern are measured and deviations from an idealistic grid are illustrated by arrows. This problem is particularly serious when X-rays are used because the X-rays have a high energy density and the heat flux density as absorbed by the mask is high.

SUMMARY OF THE INVENTION

It is an object of the present invention to provide an improved exposure method or an exposure mask therefor, by which degradation of pattern transfer precision due to distortion of a pattern of a mask produced during scan exposure can be suppressed.

It is another object of the present invention to provide a device manufacturing method which uses such an exposure method and/or exposure mask.

In accordance with a first aspect of the present invention, there is provided a scanning exposure method, comprising the steps of: relatively scanning a mask and a wafer relative to exposure light, to transfer a pattern of the mask onto the wafer; and applying a relative speed between the mask and the wafer in a scan direction, during the scan exposure, wherein the relative speed is controlled variably controlled.

In accordance with a second aspect of the present invention, there is provided a mask to be used in a scanning exposure process for relatively scanning a mask with a slit beam, comprising: a membrane; and a mask pattern formed on said membrane, wherein the mask pattern is formed with a predetermined distortion with respect to a scan direction, having been set in accordance with thermal distortion of the mask pattern to be caused during the scan exposure.

In accordance with a third aspect of the present invention, there is provided a device manufacturing method for producing devices through a process based on an exposure method or an exposure mask as described above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will be described below. In the embodiments to be described, a description will be made of examples wherein X-rays are used as exposure light. However, the invention is not limited to the use of X-rays, but light of any other wavelength such as ultraviolet rays, for example, may be used.

[Embodiment 1]

Figure 1:
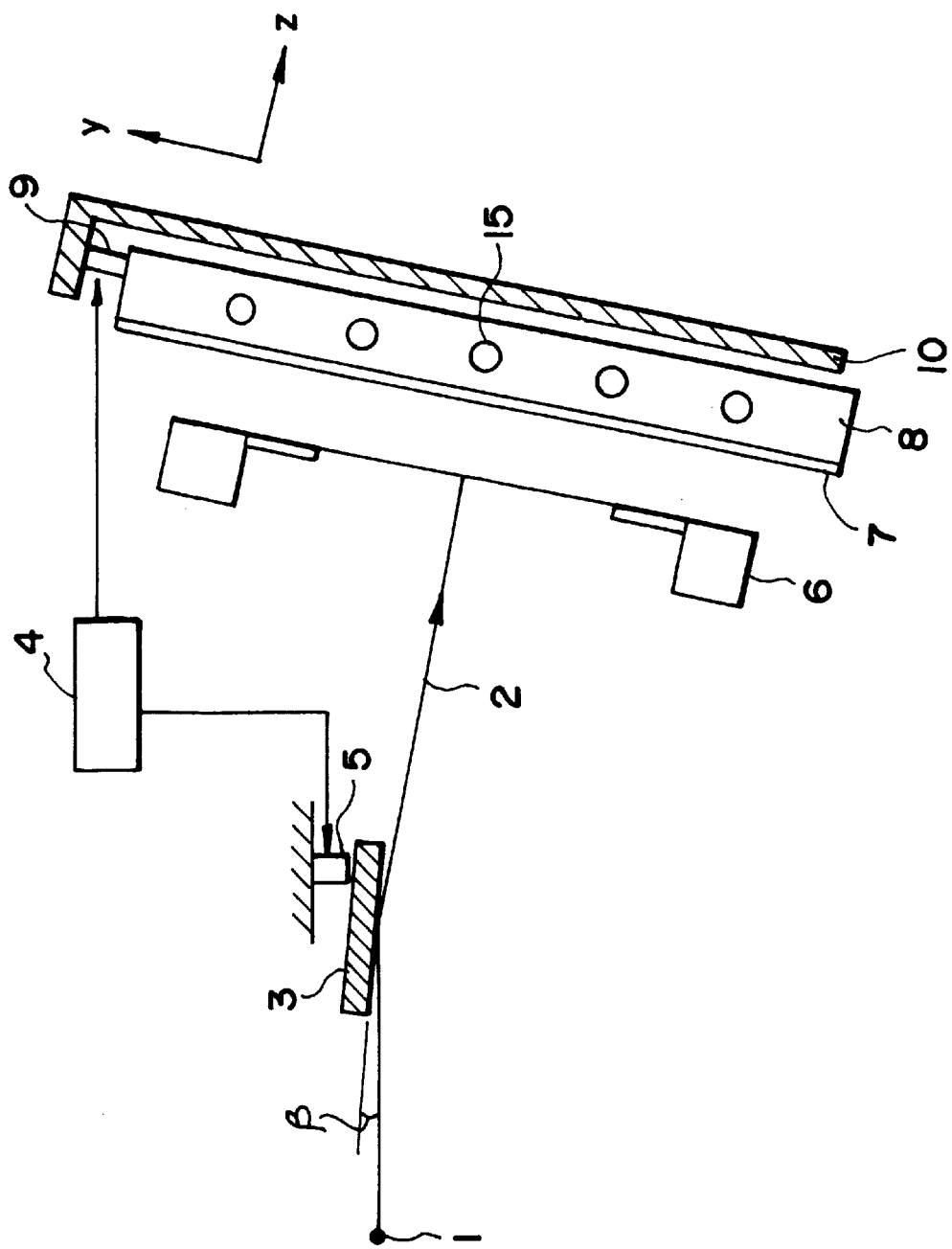
FIG. 1 is a schematic view of a main portion of an exposure apparatus according to a first embodiment of the present invention.

FIG. 1 illustrates the structure of an exposure apparatus according to an embodiment of the present invention. Sheet-like exposure light (X-rays) 2 is emitted from an emission point 1 of a synchrotron ring (SR), and it is obliquely projected on an X-ray mirror 3 and is reflected thereby. The X-ray mirror 3 is rotated at a predetermined speed, by means of an actuator 5 which is driven in accordance with a signal from a controller 4. In accordance with changes in a glancing angle β to the X-ray mirror 3 due to rotation, the slit-like exposure light 2 is moved along an X-ray mask 6 surface at a speed Vs, such that the whole exposure region on the mask is scanned. For a mask with an exposure view angle of 50 mm, as an example, the exposure light 2 may displace on the mask 6 surface at a speed Vs=50 mm/sec., by which the pattern of the X-ray mask 6 being projected onto a wafer 7, coated with a resist, may be lithographically transferred onto the wafer in a time period of 1 sec. The X-ray mask 6 is held fixed, and it does not move. On the other hand, the wafer 7 is placed on a wafer chuck 8, which is mounted on a wafer stage 10 being movable both in X and Y directions, for stepwise motion between shots. There is a Y-direction fine-motion actuator 9 between the wafer chuck 8 and the wafer stage 10. With this structure, the wafer can be moved relatively and minutely, relative to the mask. The wafer chuck 8 is equipped with a plurality of flow passageways 15 formed therewithin, for flowing a temperature medium such as water or alcohol, for maintaining the wafer temperature constant.

In the structure described above, a positional deviation of the pattern of the mask with respect to the wafer, to be produced during the scan exposure, can be corrected in the procedure to be described below.

(1) Calculation of Amount of Correction of Positional Deviation

Figure 4:
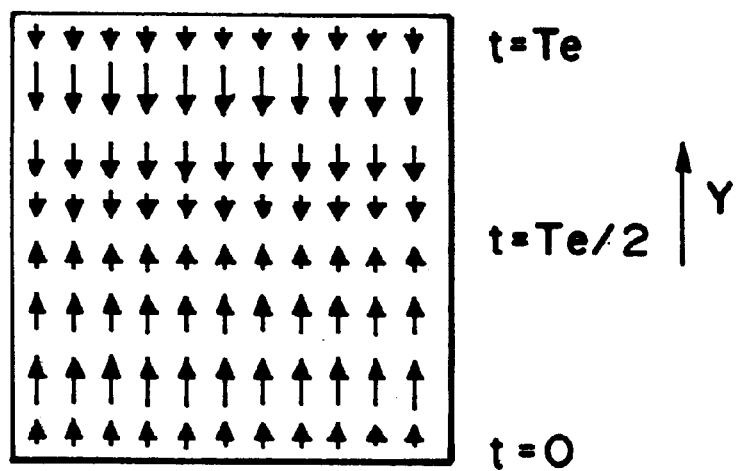
FIG. 4 is a schematic view for explaining an example of the direction and amount of pattern positional deviations, being illustrated by the use of arrows.
Figure 5:
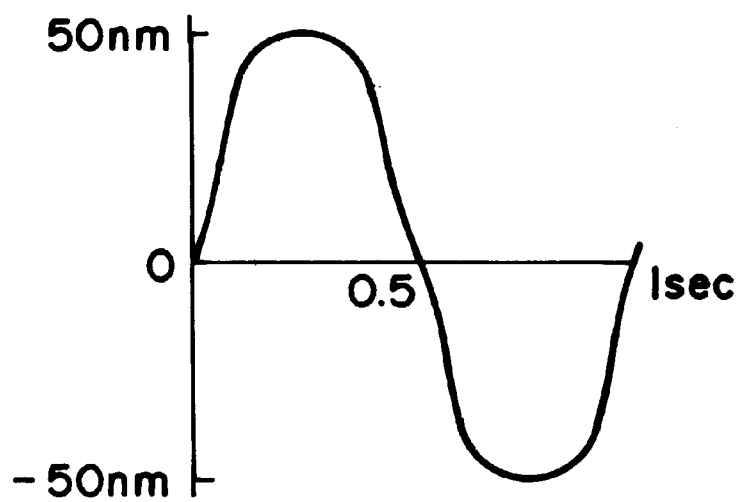
FIG. 5 is a graph which corresponds to the characteristics of the FIG. 4 example.

First, positions of a pattern transferred to the wafer 7 are measured, and deviations from an idealistic grid are calculated. It is now assumed that, from this calculation, deviation characteristics such as illustrated in FIG. 4, for example, are obtained. FIG. 5 shows these characteristics in a graph. Also, it is assumed that, when the time necessary for exposure of one shot is 1 sec. and when the amount of deviation of a pattern position is taken as a function Dy, which depends on time t from the start of exposure, it can be approximated by $Dy=A\sin(2\pi \cdot t/Te)$. In this embodiment, as an example, $Dy=-50\sin(2\pi \cdot t)$ nm such as shown in FIG. 5.

(2) Setting Wafer Movement Speed during Exposure

In order to correct the positional deviation of a mask pattern with respect to the wafer, the wafer is moved in the Y direction by an amount WDy which can be expressed by $WDy=A\sin(2\pi \cdot t/Te)$. In this example of the present embodiment, $WDy=-50\sin(2\pi \cdot t)$ nm. The controller 4 applies a signal to the fine-motion actuator 9 and controls so that, in response to a start of scan exposure, the wafer can be moved at a drive speed $WVy=-2\pi \cdot 50\cos(2\pi \cdot t)$ nm/sec corresponding to the result of differentiating WDy by t. The controller 4 produces the drive signal on the basis of a data table or a calculation formula.

Figure 6:
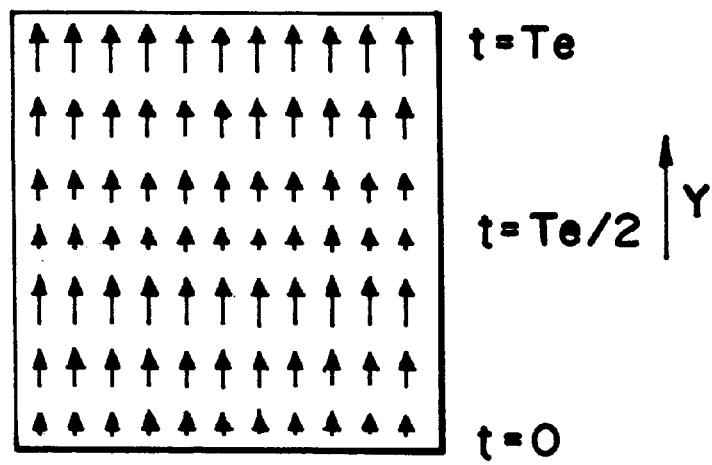
FIG. 6 is a schematic view for explaining another example of the direction and amount of pattern positional deviations, being illustrated by the use of arrows.
Figure 7:
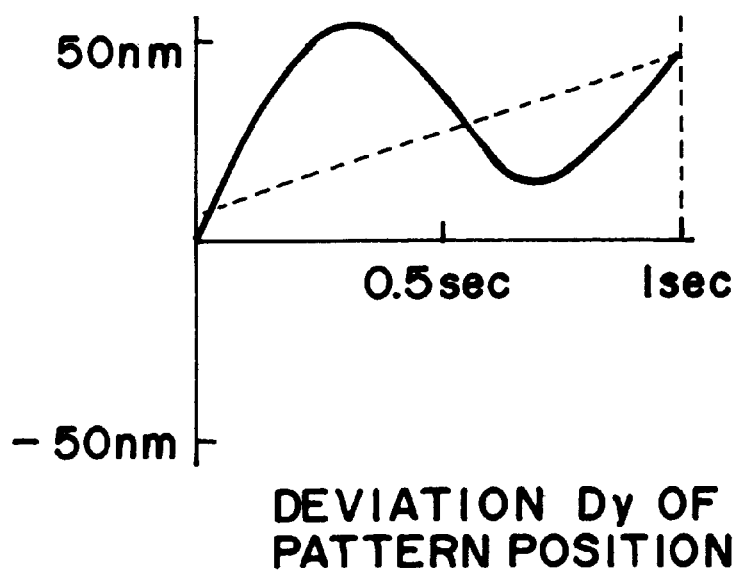
FIG. 7 is a graph which corresponds to the characteristics of the FIG. 6 example.

FIG. 6 shows another example wherein, in addition to the characteristics of FIG. 4, there is a characteristic that positional deviation in the Y direction becomes large in proportion to Y. FIG. 7 shows the characteristics of this example, in a graph. Similar to the first example, also in this case, the drive speed WVy can be calculated from Dy.

In this embodiment of the present invention, the drive speed WVy or MVy is calculated on the basis of approximating the positional deviation Dy by trigonometric function. However, the drive speed WVy or MVy may be calculated on the basis of approximating the positional deviation Dy by the use of any other function.

The pattern of the mask may be printed on one of plural shot regions on the wafer in accordance with the procedure described above. After it is completed, the wafer chuck 8 may be moved by the wafer stage 10, to a next shot region, and the same scan exposure process is repeated.

[Embodiment 2]

Figure 2:
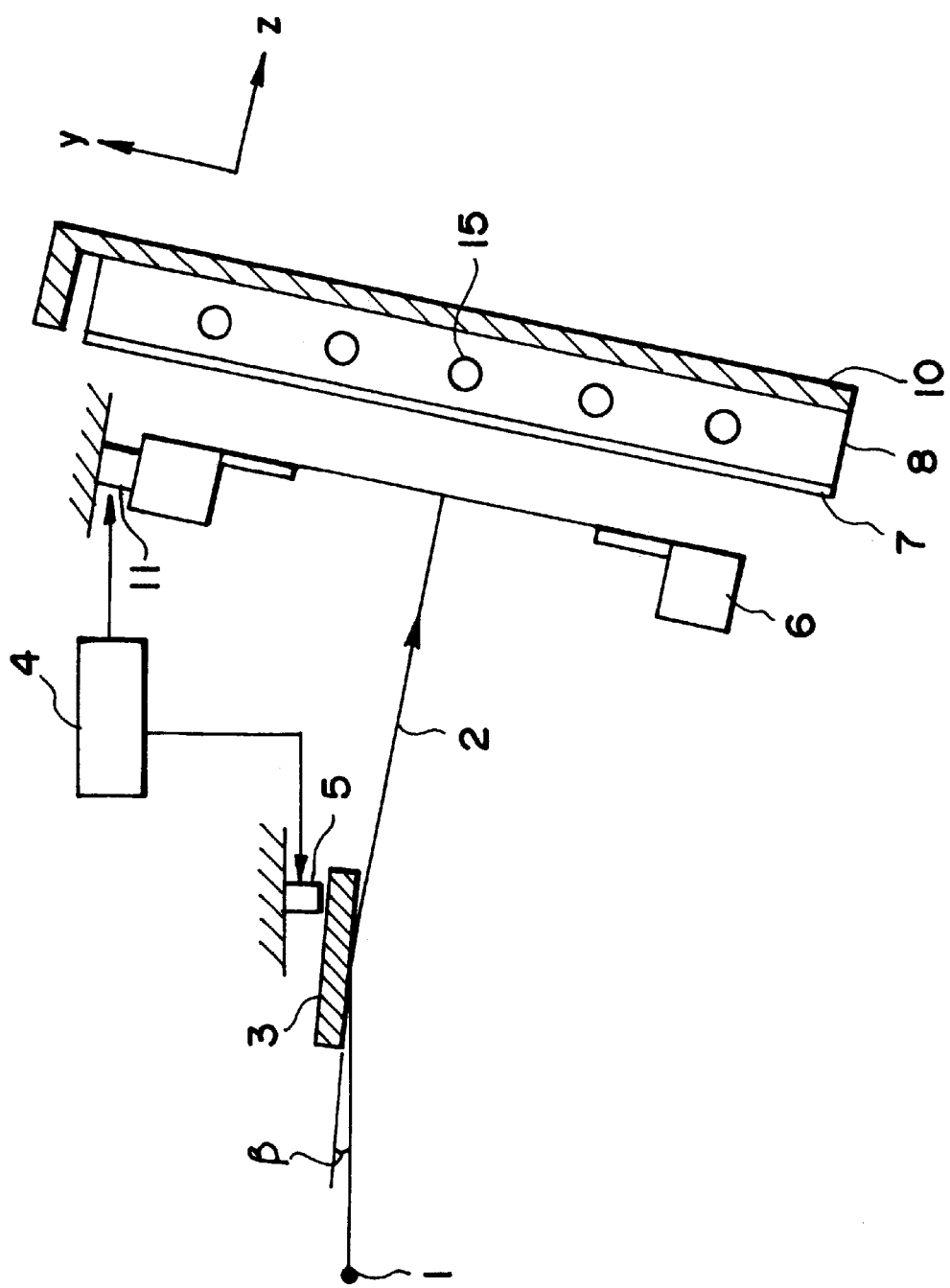
FIG. 2 is a schematic view of a main portion of an exposure apparatus according to a second embodiment of the present invention.

In the first embodiment described above, the wafer side is moved so as to apply or produce a relative speed between a mask and a wafer during scan exposure. On the other hand, the mask side may be moved as an alternative. FIG. 2 shows a structure that enables this.

Calculation of the amount of the correction of positional deviation may be essentially the same as that in the first embodiment. During scan exposure, the mask may be moved in the Y direction by an amount MDy which can be expressed by $MDy=50\sin(2\pi \cdot t)$ nm. The controller 4 applies a signal to the fine-motion actuator 11 and controls operation so that, in response to a start of scan exposure, the mask is moved at a drive speed $MVy=2\pi \cdot 50\cos(2\pi \cdot t)$ nm/sec, which corresponds to the result of differentiating MDy by t.

In this embodiment, a rough-motion stage 10 for producing stepwise motion drive, of a large stroke, is provided on the wafer side, while a Y-direction fine-motion mechanism is provided on the mask side. As a result of this, the wafer support rigidity is higher than that of the first embodiment. Therefore, vibration of the wafer chuck 8 as the temperature adjusting medium flows through the passageways 15 in the wafer chuck 8 can be reduced, and further enhancement of pattern transfer precision is attainable.

[Embodiment 3]

In the embodiments described above, the mask pattern is transferred to the wafer by a single scan to one picture angle. However, the exposure of one picture angle may be made with repeated scans. The following embodiment corresponds to this.

In the first scan, the exposure light is moved in a +Y direction of the picture angle. After the scan of the picture angle, it is shifted in the +Y direction from the upper end of the picture angle of the mask. Thereafter, it is moved reversely and in a −Y direction, and it is placed at the upper end of the picture angle of the mask. In the subsequent second scan, the exposure light is moved in the −Y direction of the picture angle until it reaches the lower end of the picture angle of the mask. If the time necessary for one scan is Ts, and the time from the end of the first scan to the start of a second scan is I, the time I is the period necessary for the reverse of the exposure light. During this time I, the exposure light moves in the +Y direction, from the upper end of the picture angle of the mask and, thereafter, it moves reversely in the −Y direction and is placed again at the upper end of the picture angle of the mask. After this, the second scan is performed. Thus, the exposure time Te is Te=2·Ts+I.

As regards the pattern positional deviation Dy in FIG. 4, if t is in a relation 0<t<Ts and Dy can be approximated as $Dy=-50\sin(2\pi \cdot t/Ts)$ nm, it follows that, when Ts+I<t<2·Ts+I, Dy is $Dy=50\sin\{2\pi \cdot (t-I)/Ts\}$ nm. The wafer may be moved at a drive speed WVy to correct this mask pattern positional deviation to thereby avoid deterioration of the precision of registration with respect to the wafer. The drive speed WVy may be $WVy=-2\pi/Ts \cdot 50\cos\{2\pi \cdot t/Ts\}$ nm/sec if $0 \leq t < Ts$, and it may be $2\pi/Ts \cdot 50\cos\{2\pi \cdot (t-I)/Ts\}$ nm/sec if $Ts+I \leq t < 2 \cdot Ts+I$. With this wafer drive, the positional deviation of the mask pattern caused by the scan exposure can be corrected. Here, if the exposure light is scanningly moved in the −Y direction, the wafer may be moved at a speed calculated by multiplying, by −1, the wafer drive speed relative to the mask in the case of the +Y direction scan. Namely, the controller 4 may include a data table or calculation formulae, related to the amount of drive of the mirror in the positive direction and the drive speed of the wafer relative to the mask.

[Embodiment 4]

In this embodiment, the X-ray mirror is held fixed and the exposure beam is held stationary, while the mask and the wafer are moved at a speed −Vs. Additionally, a fine-motion actuator is used to provide variable relative speed between the mask and the wafer during the scan exposure to thereby correct the positional deviation of the mask pattern with respect to the wafer.

Figure 3:
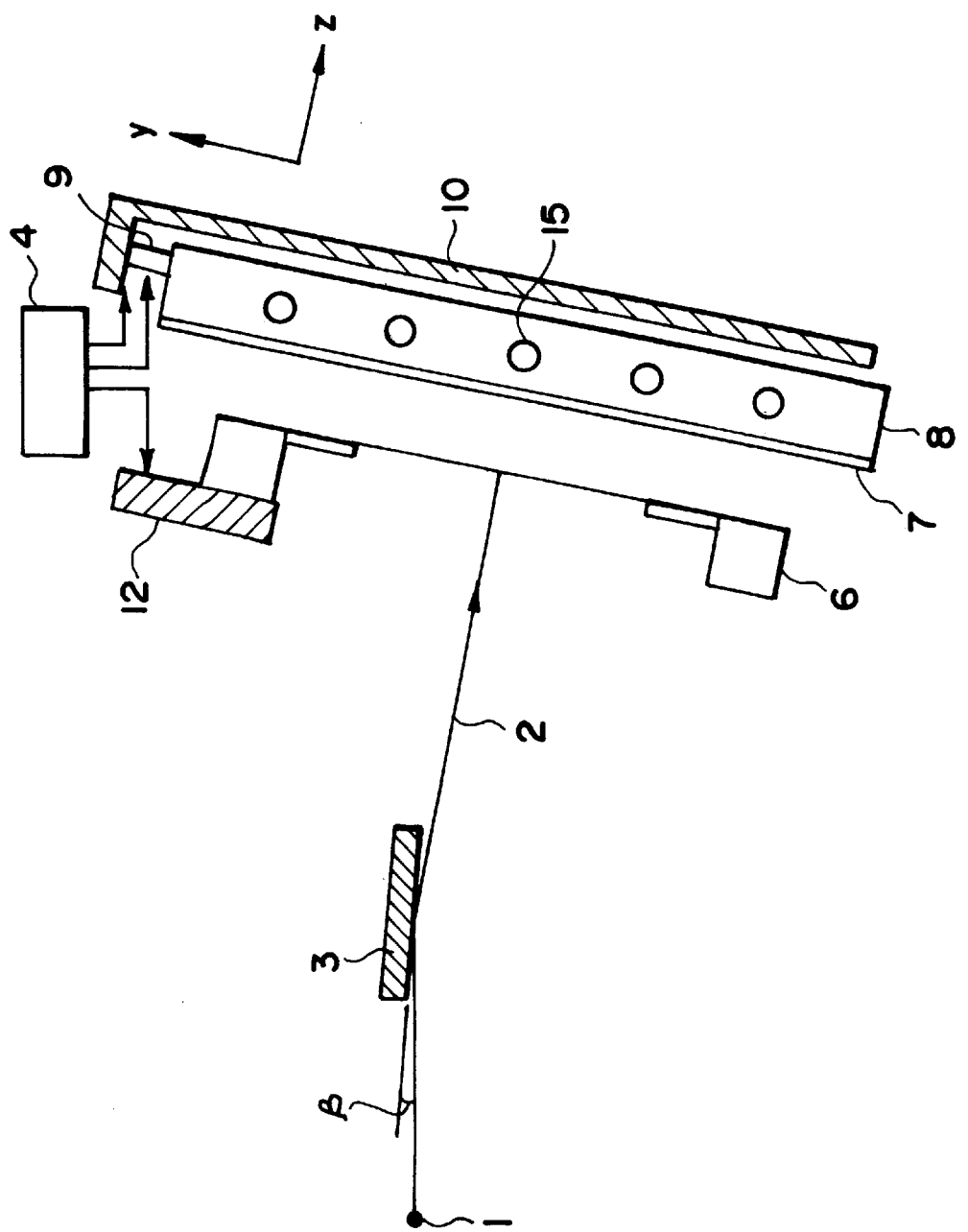
FIG. 3 is a schematic view of a main portion of an exposure apparatus according to a third embodiment of the present invention.

FIG. 3 shows a structure which enables this. The X-ray mirror 3 is held fixed, and it does not move. The scan of the wafer relative to the exposure beam is performed by the use of a wafer stage 10, and the scan of the mask is performed by the use of a mask stage 12. During scan exposure, a fine-motion actuator 11 applies a relative speed between the mask and the wafer, as has been described with reference to the embodiment explained above. Also, this relative speed is changed to correct the mask pattern deviation.

[Embodiment 5]

In the embodiments described above, the relative speed of the mask and the wafer is changed to thereby correct or compensate for the pattern distortion due to thermal distortion of the mask. To the contrary, however, if the design is made while taking such thermal distortion of the mask itself into account, correct pattern transfer can be made without relative displacement of the mask and the wafer.

More specifically, while the thermal distortion of the mask pattern to be produced during the scan may be taken into account, the mask pattern may be formed beforehand with a predetermined distortion with respect to the scan direction. On that occasion, if thermal distortion is produced in the mask when it is in use, the mask pattern to be transferred as a consequence to the wafer has substantially no distortion. Thus, a desired pattern can be transferred. The mask pattern may be designed with an intentional contraction/expansion in the scan direction, in accordance with the distortion characteristics such as shown in FIG. 4 or 6.

[Embodiment 6]

Next, an embodiment of a semiconductor device manufacturing method which uses an exposure apparatus such as described hereinbefore, will be explained.

Figure 8:
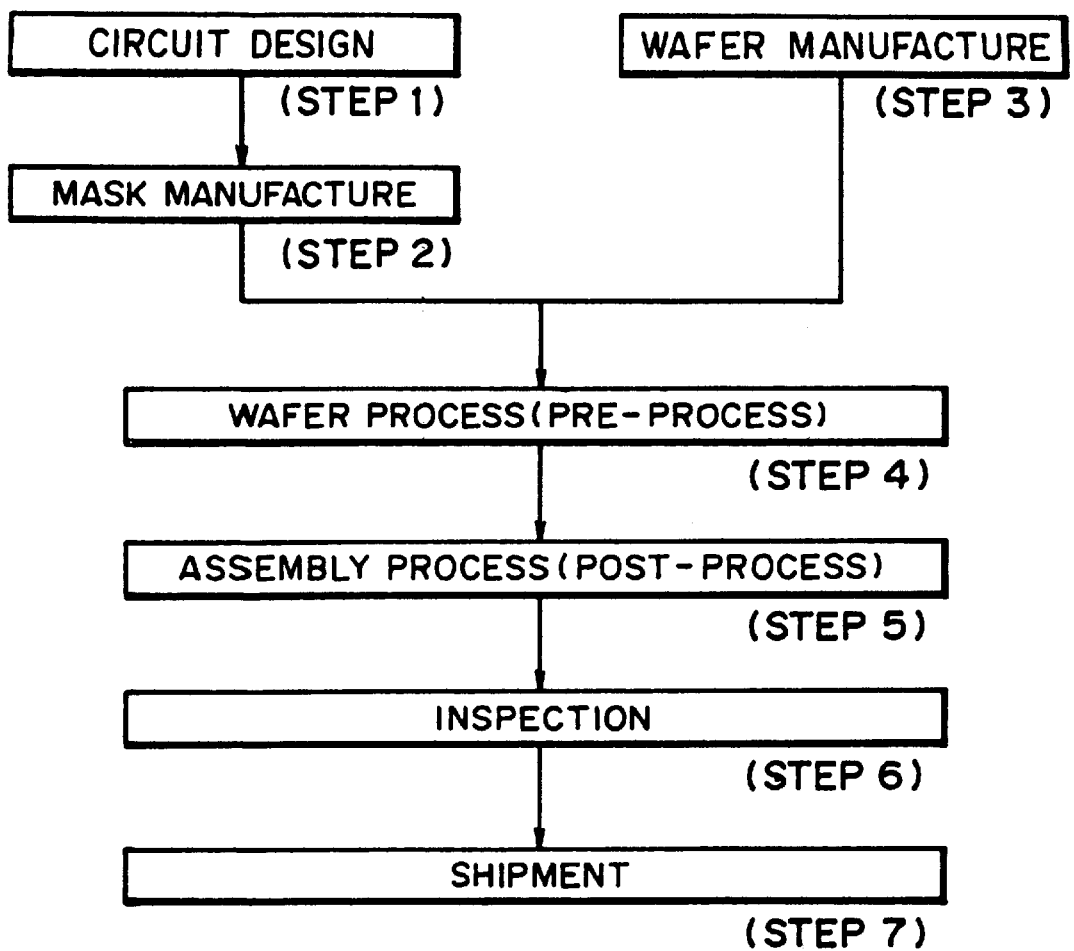
FIG. 8 is a flow chart of device manufacturing processes.

FIG. 8 is a flow chart of a procedure for the manufacture of microdevices such as semiconductor chips (e.g., ICs or LSIs), liquid crystal panels or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 9:
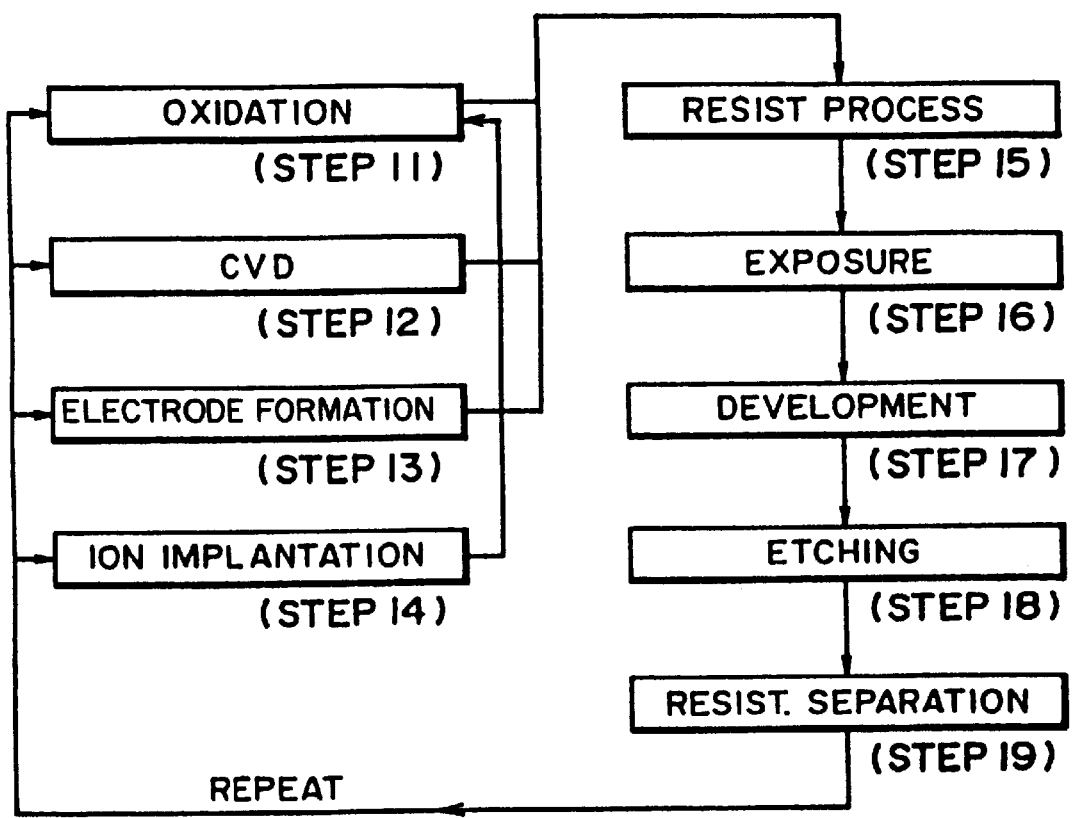
FIG. 9 is a flow chart for explaining the details of a wafer process.

FIG. 9 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A scanning exposure method, comprising the steps of:
    relatively scanning a mask and a wafer relative to exposure light of a slit beam, to transfer a pattern of the mask onto the wafer; and
    controlling a speed ratio between the mask and the wafer in a scan direction, during the scan exposure in one shot area, wherein the speed ratio is changed in accordance with thermal distortion of the mask pattern caused during the scan exposure.

2. A method according to claim 1, further comprising moving the wafer during the scan exposure to produce the relative speed.

3. A method according to claim 1, further comprising moving the wafer during the scan exposure to produce the relative speed.

4. A method according to claim 1, wherein the exposure light comprises X-rays.

5. A method according to claim 4, wherein the exposure light comprises synchrotron radiation provided by a synchrotron radiation source.

6. A scanning exposure method according to claim 1, wherein the mask comprises a membrane having a mask pattern formed thereon.

7. A mask to be used in a scanning exposure process for relatively scanning a mask with a slit beam, said mask comprising:
    a membrane; and
    a mask pattern formed on said membrane,
    wherein said mask pattern is formed with a predetermined intentional distortion designed with respect to intentional contraction or expansion with respect to a scan direction, in accordance with thermal distortion of the mask pattern to be caused during the scan exposure.

8. A mask according to claim 7, wherein said mask is an X-ray mask.

9. A device manufacturing method for producing devices, said method comprising:
    relatively scanning a mask and a wafer relative to exposure light of a slit beam, to transfer a pattern of the mask onto the wafer to produce a device; and
    controlling a speed ratio between the mask and the wafer in a scan direction, during the scan exposure in one shot area, wherein the speed ratio is changed in accordance with thermal distortion of the mask pattern caused during the scan exposure.

10. A method according to claim 9, further comprising moving the wafer during the scan exposure to produce the relative speed.

11. A method according to claim 9, further comprising moving the mask during the scan exposure to produce the relative speed.

12. A method according to claim 9, wherein the mask comprises a membrane having a mask pattern formed thereon.

13. A method according to claim 9, wherein the exposure light comprises X-rays.

14. A method according to claim 13, wherein the exposure light comprises synchrotron radiation provided by a synchrotron radiation source.

* * * * *

UNITED STATES PATENT AND TRADEMARK OFFICE
CERTIFICATE OF CORRECTION

PATENT NO. : 5,994,003

DATED : November 30, 1999

INVENTORS : SHINICHI HARA, ET AL.

It is certified that error appears in the above-identified patent and that said Letters Patent is hereby corrected as shown below:

COLUMN 2:
Line 7, "controlled" (first occurrence) should be deleted.

Signed and Sealed this

Fourteenth Day of November, 2000

Attest:

Q. TODD DICKINSON

Attesting Officer        Director of Patents and Trademarks